United States Patent
Kuo et al.

(10) Patent No.: US 12,243,848 B2
(45) Date of Patent: Mar. 4, 2025

(54) METHODS AND SYSTEMS FOR IMPROVING FUSION BONDING

(71) Applicant: Taiwan Semiconductor Manufacturing Company, Ltd., Hsinchu (TW)

(72) Inventors: Hong-Ta Kuo, Hsinchu (TW); Yen Hao Huang, Hsinchu (TW); I-Shi Wang, Taipei (TW); Ming-Yi Shen, Miaoli (TW); Tzu-Ping Yang, Hsinchu (TW); Hsing-Yu Wang, Hsinchu (TW); Huang-Liang Lin, Hsinchu (TW); Yin-Tung Chou, Hsinchu (TW); Yuan-Hsin Chi, Taichung (TW); Sheng-Yuan Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 457 days.

(21) Appl. No.: 17/666,933

(22) Filed: Feb. 8, 2022

(65) Prior Publication Data

US 2022/0367405 A1 Nov. 17, 2022

Related U.S. Application Data

(60) Provisional application No. 63/188,852, filed on May 14, 2021.

(51) Int. Cl.
*H01L 23/00* (2006.01)
*H01J 37/32* (2006.01)
*H01L 21/687* (2006.01)

(52) U.S. Cl.
CPC ........ *H01L 24/80* (2013.01); *H01J 37/32715* (2013.01); *H01J 37/32807* (2013.01); *H01L 21/68742* (2013.01); *H01L 21/68757* (2013.01); *H01L 24/74* (2013.01); *H01L 2224/80031* (2013.01); *H01L 2224/80896* (2013.01); *H01L 2224/80908* (2013.01)

(58) Field of Classification Search
CPC .............. H01L 24/80; H01L 21/68742; H01L 21/68757; H01L 2224/80031; H01L 2224/80896; H01L 2224/80908; H01J 37/32807; B81C 2203/036
USPC ......................................................... 488/455
See application file for complete search history.

(56) References Cited

U.S. PATENT DOCUMENTS

2018/0182656 A1* 6/2018 Sato ................. H01J 37/32935
2019/0214290 A1* 7/2019 Marcelynas ...... H01L 21/68742

* cited by examiner

*Primary Examiner* — Nduka E Ojeh
*Assistant Examiner* — Laura M Dykes
(74) *Attorney, Agent, or Firm* — Lippes Mathias LLP

(57) ABSTRACT

Methods and systems for improving fusion bonding are disclosed. Plasma treatment is performed on a substrate prior to the fusion bonding, which leaves residual charge on the substrate to be fusion bonded. The residual charge is usually dissipated through an electrically conductive silicone cushion on a loading pin. In the methods, the amount of residual voltage on a test silicon wafer is measured. If the residual voltage is too high, this indicates the usable lifetime of the silicone cushion has passed, and the electrically conductive silicone cushion is replaced. This ensures the continued dissipation of residual charge during use in production, improving the quality of fusion bonds between substrates.

20 Claims, 11 Drawing Sheets

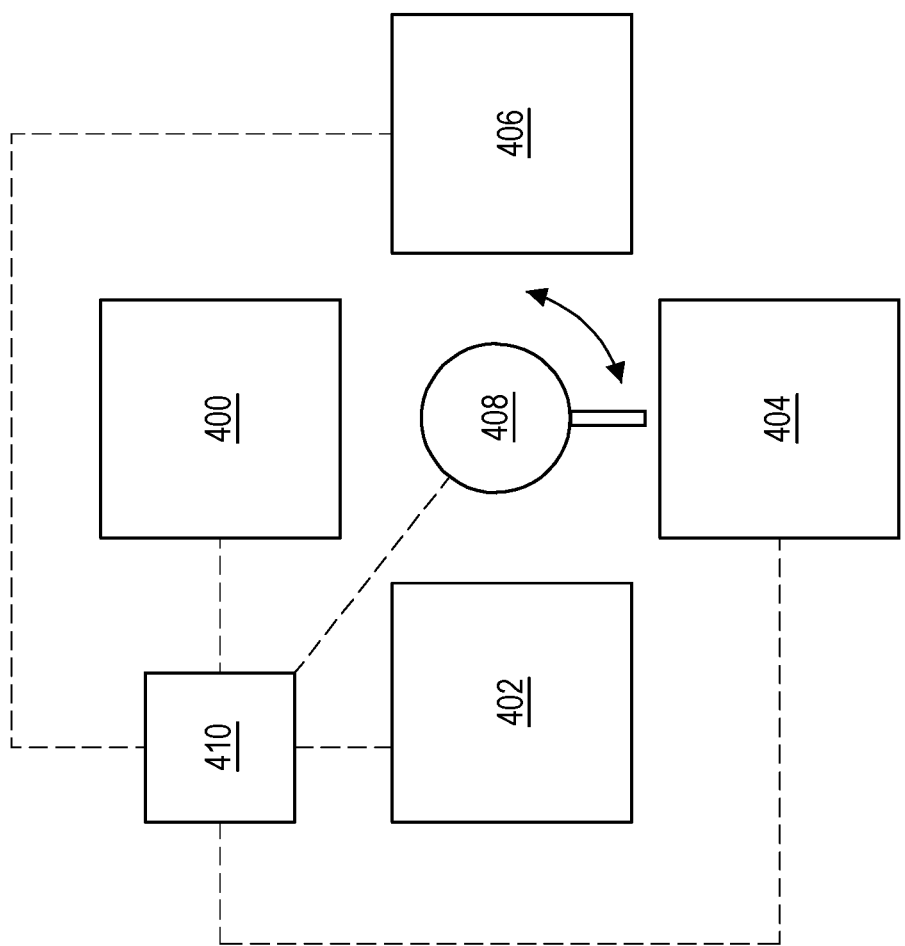

METHODS AND SYSTEMS FOR IMPROVING FUSION BONDING

PRIORITY CLAIM AND CROSS-REFERENCE

This application claims priority to U.S. Provisional Patent Application Ser. No. 63/188,852, filed on May 14, 2021, which is incorporated by reference in its entirety.

BACKGROUND

In wafer-to-wafer bonding technology, various methods have been developed to bond two package components (such as wafers) together. Some wafer bonding methods include fusion bonding (also known as direct bonding), which is a process for joining surfaces together without intermediate layers. The process is based on the formation of chemical bonds between the surfaces when the surfaces are sufficiently flat, clean, and smooth.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is a plan view of a layout of various stations used in the plasma treatment and fusion bonding processes of the present disclosure, in accordance with some embodiments.

DETAILED DESCRIPTION

Figure 1:
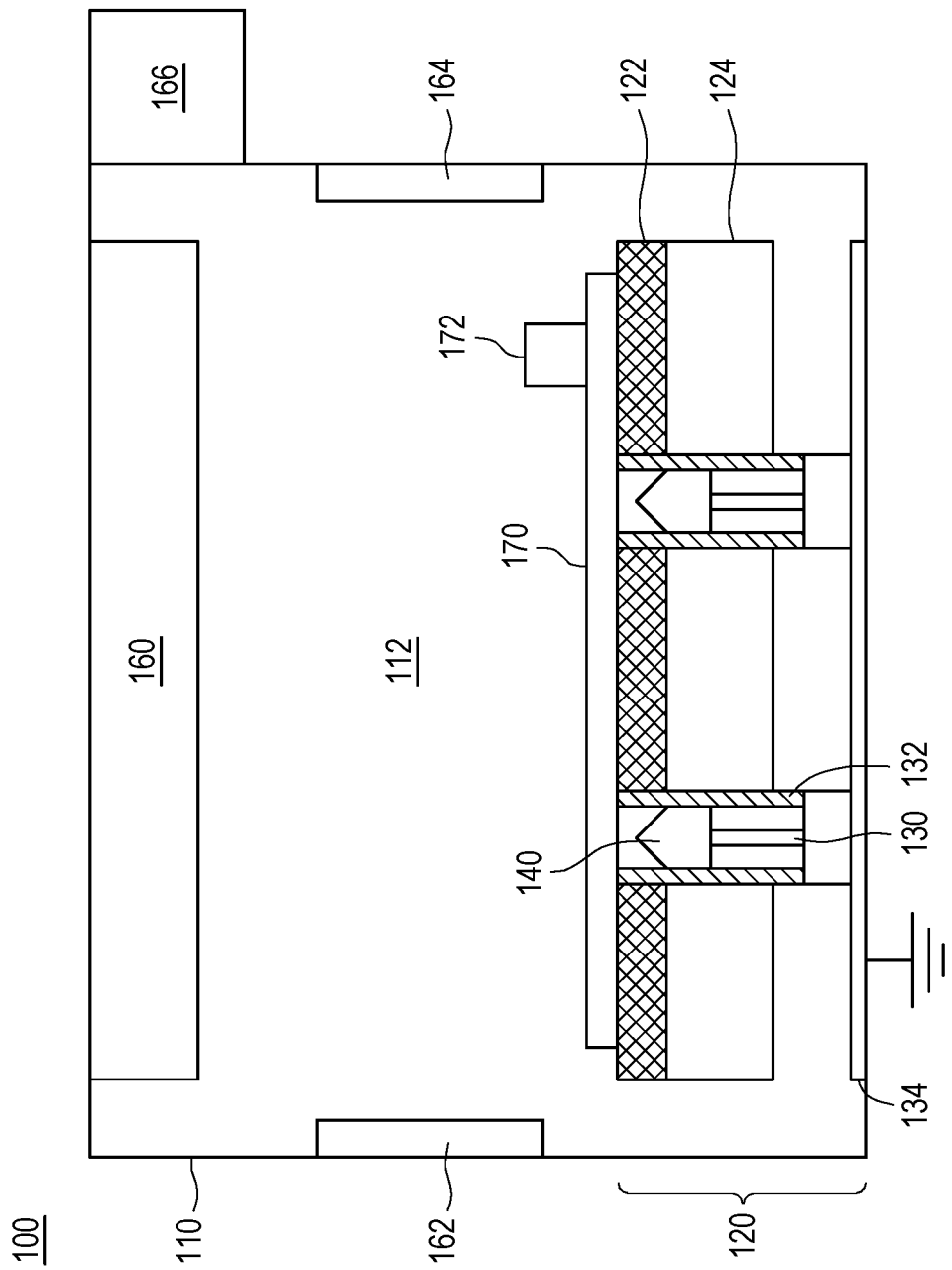
FIG. 1 is a side cross-sectional view illustrating one embodiment of a plasma treatment tool of the present disclosure for practicing the methods of the present disclosure. This figure shows the various components of the plasma treatment tool.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The present disclosure relates to methods and systems for improving fusion bonding and the quality of the bond produced between two substrates. In this regard, plasma treatment before fusion bonding is commonly performed to create a hydrophilic surface on one or both of the substrates prior to the bonding process. However, if the residual voltage left on the substrate is too high, then adverse effects can occur during fusion bonding. The residual voltage is usually dissipated to ground, but if the conductive path to ground has too high a resistance, then the residual voltage will be not fully dissipated. This fact is used in the present disclosure to determine the service lifetime and replacement of certain silicone cushions used in the plasma treatment tool.

Figure 2:
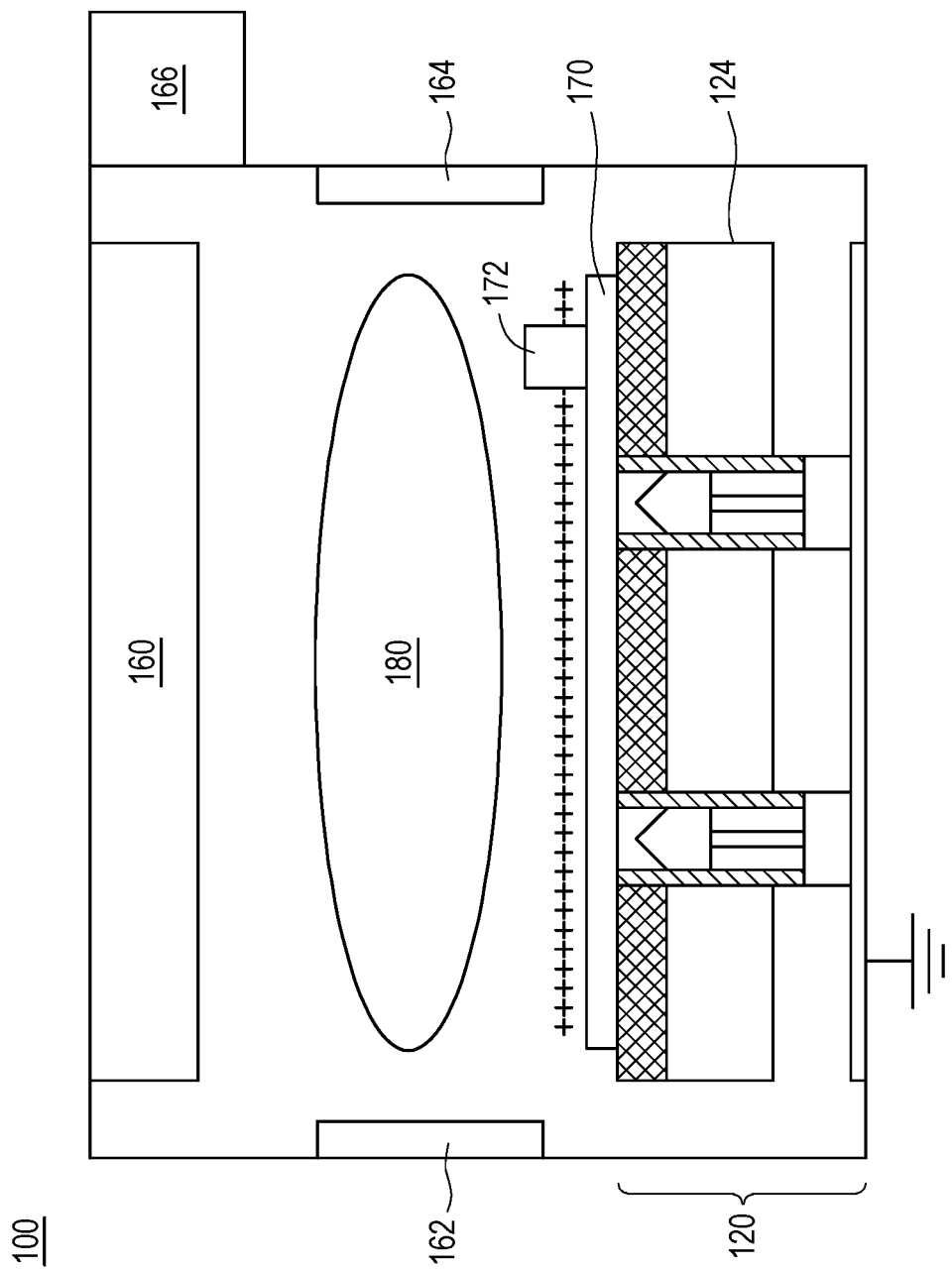
FIG. 2 is a side cross-sectional view showing the plasma treatment tool of FIG. 1 performing plasma treatment.
Figure 3:
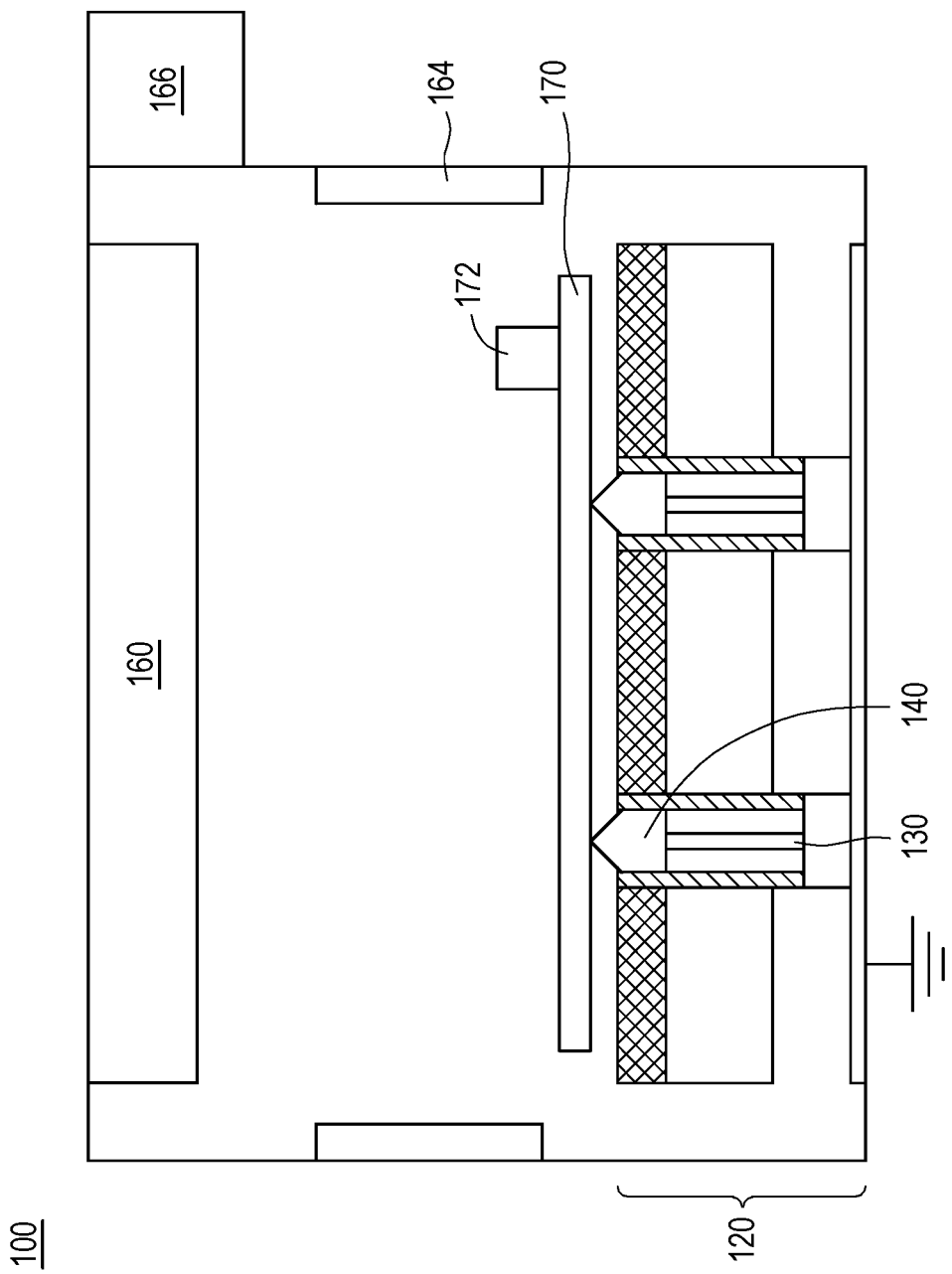
FIG. 3 is a side cross-sectional view showing the plasma treatment tool of FIG. 1 after plasma treatment, with loading pin cushions contacting the wafer substrate to dissipate residual charge.

FIGS. 1-3 are a set of side cross-sectional schematic diagrams illustrating one example system of the present disclosure in which the methods of the present disclosure can be practiced, in accordance with some embodiments, as well as one example method. The system 100 is a plasma treatment tool.

Referring first to FIG. 1, the system includes a housing 110 with an internal volume 112. A wafer support pedestal 120 is present within the housing. The pedestal may be configured to hold a semiconductor wafer substrate in a desired position. For example, the pedestal may apply vacuum pressure to hold the wafer substrate in place by suction. Alternatively, the pedestal may interact mechanically, for example using clamps or retaining rings or the like to hold the wafer substrate in place using a mechanical holding force. An electrostatic holding force might also be used to secure the wafer substrate.

The pedestal 120 includes a support surface 122 which contacts the wafer substrate. The support surface itself is usually made of an electrically insulating material. A bottom electrode 124 is located below the support surface 122. Extending through the bottom electrode and the support surface are loading pins 130, which are used to raise the lower and wafer substrate. Each loading pin includes an electrically conductive cushion 140 located at the top of the loading pin. In some particular embodiments, the loading pin cushion is made from an electrically conductive silicone. Each loading pin is located within an electrically insulating tube 132, for example made of quartz or other suitable material. Each loading pin 130 is also electrically connected to a loading pin base 134, which goes to ground. The loading pin and loading pin base include electrically conductive materials, such as copper, aluminum, nickel, or other suitable metals.

Continuing, an upper electrode 160 is located above the wafer support pedestal 120. The system also includes one or more gas inlets 162, through which process gases are introduced into the internal volume. The gas inlet(s) are connected to gas sources for providing the specified gas. One or more gas outlets 164 is also present for removing undesired gases, and for reducing the pressure within the housing. A gas outlet can be connected to a pump (not shown) for creating vacuum. The inlet(s) and outlet(s) are typically located on different walls of the housing. A door (not shown) is also present for accessing the internal volume, to insert and remove the wafer substrate.

Finally, a controller 166 is used to control the various inputs and outputs, and to measure various conditions within the housing for the plasma treatment process. The system may also include sensors for monitoring applicable parameters. For example, such sensors may include those for tracking the flow rate of various gases, for measuring the content of gases exiting the chamber, for measuring the pressure within the chamber, etc. The controller can also determine whether to activate or deactivate the electrodes, and potentially also control the motion of any automated handling system that may be present. It is noted that these various parameters may not have to be held steady during operation, and could be changed by the controller operating a computer program which alters their setpoints as appropriate. The controller may also include a user interface for communicating with operators.

When used for production, the wafer substrate itself can be a wafer made of any semiconducting material. Such materials can include silicon, for example in the form of crystalline Si or polycrystalline Si. In alternative embodiments, the substrate can be made of other elementary semiconductors such as germanium, or may include a compound semiconductor such as silicon carbide (SiC), gallium arsenide (GaAs), indium arsenide (InAs), and indium phosphide (InP).

However, in FIG. 1, a dummy or test silicon wafer 170 is shown. The silicon wafer is bare, or in other words no other layers are present on the dummy silicon wafer. In some embodiments, the dummy silicon wafer includes a charge monitor 172 thereon, which measures the voltage on the dummy silicon wafer. The dummy silicon wafer is used in the methods of the present disclosure to measure the performance of the plasma treatment system. Note that in this figure, the loading pin cushions 140 do not contact the test silicon wafer 170.

In FIG. 2, plasma treatment is performed upon the test silicon wafer 170. The plasma treatment can be performed, for example, by a dielectric barrier discharge (DBD) process, a reactive ion etching (RIE) process, a remote plasma, or a sequential plasma (SPAB) process. In some embodiments, the plasma treatment is performed in a vacuum environment, for example with the pressure within the housing being from about 0.1 pascals (Pa) to about 100 Pa. However, the pressure may be higher and could simply be sub-atmospheric, for example a pressure of about 10 kPa to about 95 kPa (for comparison, atmospheric pressure is about 101 kPa). The process gas used for generating the plasma may include one or more gases such as nitrogen ($N_2$), hydrogen ($H_2$), or argon (Ar) that enter through the gas inlet 162. Voltage is applied between the upper electrode 160 and the lower electrode 124, creating a plasma 180. The power used to generate the plasma may range from about 10 watts (W) to about 2,000 W. Note that in this figure, the loading pin cushions 140 still do not contact the test silicon wafer 170.

When used in production, the plasma treatment removes contaminants from the surface of a wafer substrate. In addition, the surface is made hydrophilic by increasing the number of —OH groups on the surface, which is beneficial for forming strong fusion bonds. Due to the plasma treatment, a residual voltage may remain on the wafer substrate, indicated here as a positive charge on the test silicon wafer 170.

In FIG. 3, the loading pins 130 are raised to elevate the test silicon wafer 170 above the pedestal 120. The loading pin cushions 140 now contact the bottom of the test silicon wafer 170, and the residual charge on the test silicon wafer is dissipated to ground. Automated handling tools (not shown) can then grasp the wafer/semiconductor wafer substrate to a subsequent processing tool.

In this regard, it has been found that as the loading pin cushions age, their resistance increases until the residual charge (i.e. voltage) is unable to be fully dissipated. Thus, the measurement of the residual charge/voltage is used to determine whether the loading pin cushion(s) of the plasma treatment tool need to be replaced. If the measured residual voltage on the test silicon wafer is greater than about +100 volts (V), then at least one cushion on a loading pin of the wafer support pedestal is replaced with a new cushion. In more specific embodiments, at least one loading pin cushion is replaced if the measured residual voltage on the test silicon wafer is greater than about +300 volts, or greater than about +3000 volts. In further embodiments, all of the cushions on the loading pins are replaced with new cushions.

It is noted that as illustrated in FIGS. 1-3, the charge monitor 172 is shown as being attached to the test silicon wafer and going through the plasma treatment process itself. It is contemplated that the charge monitor can communicate wirelessly with the controller 166. If the measured residual voltage is above the threshold voltage (about +100 volts, about +300 volts, or about +3000 volts), the controller can generate an alarm indicating the cushions need to be serviced or replaced. This condition indicates residual voltage on substrates going through the plasma treatment tool are not being sufficiently dissipated. Thus, an alarm can be automatically generated if desired.

Alternatively, the test silicon wafer does not include the charge monitor during the plasma treatment process. Instead, a charge monitor (e.g. a voltmeter) can be applied to the test silicon wafer after the plasma treatment process and contact with the loading pin cushions to dissipate voltage have been completed. The residual voltage can then be measured to determine whether the loading pin cushion (s) need to be replaced. This can be done automatically using a metrology station which applies leads to the test silicon wafer, or can be done manually by an operator if desired.

After the cushion(s) on the loading pin(s) are replaced, the plasma treatment process can be run again using the same or different test silicon wafer. Desirably, the measured residual charge with the new cushions affixed to the loading pin(s) is successfully reduced to less than +100 volts. This indicates that residual voltage can be successfully dissipated through the loading pin cushions and through the loading pins down to the loading pin base.

FIGS. 4-7 are a set of side cross-sectional schematic diagrams which illustrate the further processing of wafer substrates after plasma treatment through fusion bonding, in accordance with some embodiments of the present disclosure.

Figure 4:
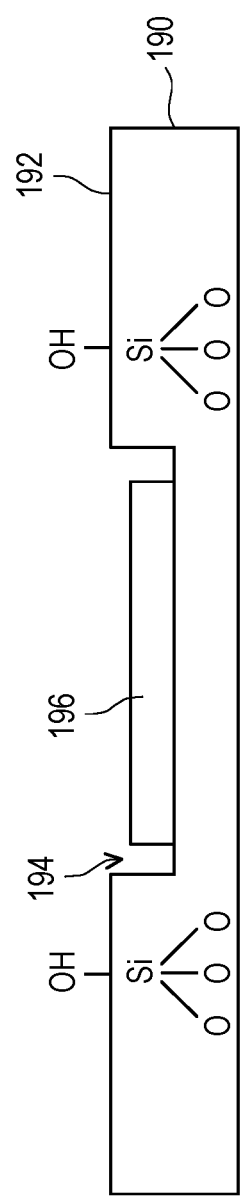
FIG. 4 is an illustrative side view of a wafer substrate after plasma treatment, in accordance with some embodiments. An explanation of increased hydrophilicity/surface energy is provided.

Referring initially to FIG. 4, after the plasma treatment illustrated in FIGS. 1-3, the surface 192 of a first wafer substrate 190 is more hydrophilic. Put another way, the surface energy is increased. As illustrated here with reference to a silicon wafer substrate, the surface of the first wafer substrate can be illustrated as formed from silicon oxide and containing free silanol groups.

It is noted that for fusion bonding, the surface of the wafer substrate to be bonded should generally be flat and clean. Chemical-mechanical planarization (CMP) may be used to obtain a flat surface on the wafer substrate, and is usually performed prior to the plasma treatment. In some embodiments, the first wafer substrate may be cleaned after the plasma treatment. This cleaning step may be performed, for example, using cleaning solutions containing ammonium hydroxide, hydrogen peroxide, acids such as sulfuric acid or hydrochloric acid, and/or deionized water.

In some particular embodiments as illustrated here, the first wafer substrate 190 is a MEMS wafer which contains Micro-Electro-Mechanical Systems, and the second wafer substrate is a capping wafer intended to encapsulate the MEMS device. The first wafer substrate 190 is illustrated as containing a cavity 194 having a MEMS device 196 therein.

The MEMS device may include a plurality of elements formed on metal, polysilicon, dielectric, and/or other materials. The MEMS device may include materials typically used in a conventional CMOS fabrication process. The MEMS device may include mechanical structures, electrical structures, or fluid structures. The MEMS device may be formed using typical processes used in CMOS fabrication, for example, photolithography, etching processes (e.g., wet etch, dry etch, plasma etch), deposition processes, plating processes, and/or other suitable processes.

Figure 5:
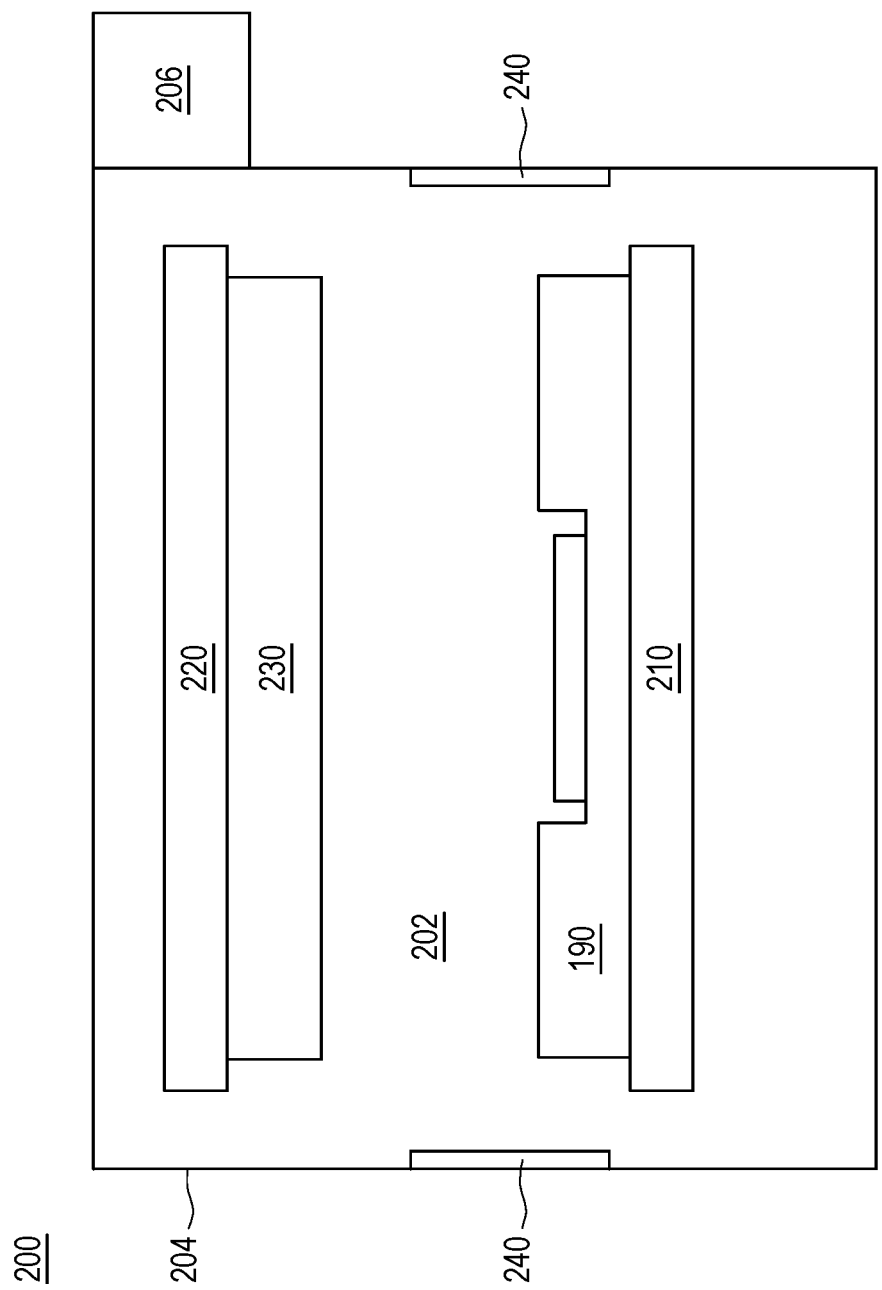
FIG. 5 is a side cross-sectional view illustrating one embodiment of a fusion bonding tool of the present disclosure for practicing the methods of the present disclosure. This figure shows the various components of the fusion bonding tool.

Next, FIG. 5 illustrates a fusion bonding tool 200. The fusion bonding tool includes a wafer bonding chamber 202 within a housing 204. The chamber contains a first wafer support pedestal 210 and a second wafer support pedestal 220 positioned opposite one another. The first wafer support pedestal 210 holds the first wafer substrate 190, and the second wafer support pedestal 220 holds a second wafer substrate 230. The two wafer substrates 190, 230 face each other. At least one of the two wafer substrates has undergone plasma treatment, and it is contemplated that both wafer substrates have undergone plasma treatment to activate their surfaces. The fusion bonding tool 200 may be in the form of a separate workstation/tool from the plasma treatment tool 100 shown in FIG. 1, or may be integrated therewith.

Again, a controller 206 is used to control the various inputs and outputs, and to measure various conditions within the housing for the fusion bonding process. Different sensors may be present, as different parameters are relevant in the fusion bonding process. For example, such sensors may include those for aligning and tracking the movement of the two wafer support pedestals, for measuring the pressure/pressing force applied during fusion bonding, for measuring and controlling the gas content within the chamber, the temperature and pressure within the chamber, etc. The controller may also include a user interface for communicating with operators.

Figure 6:
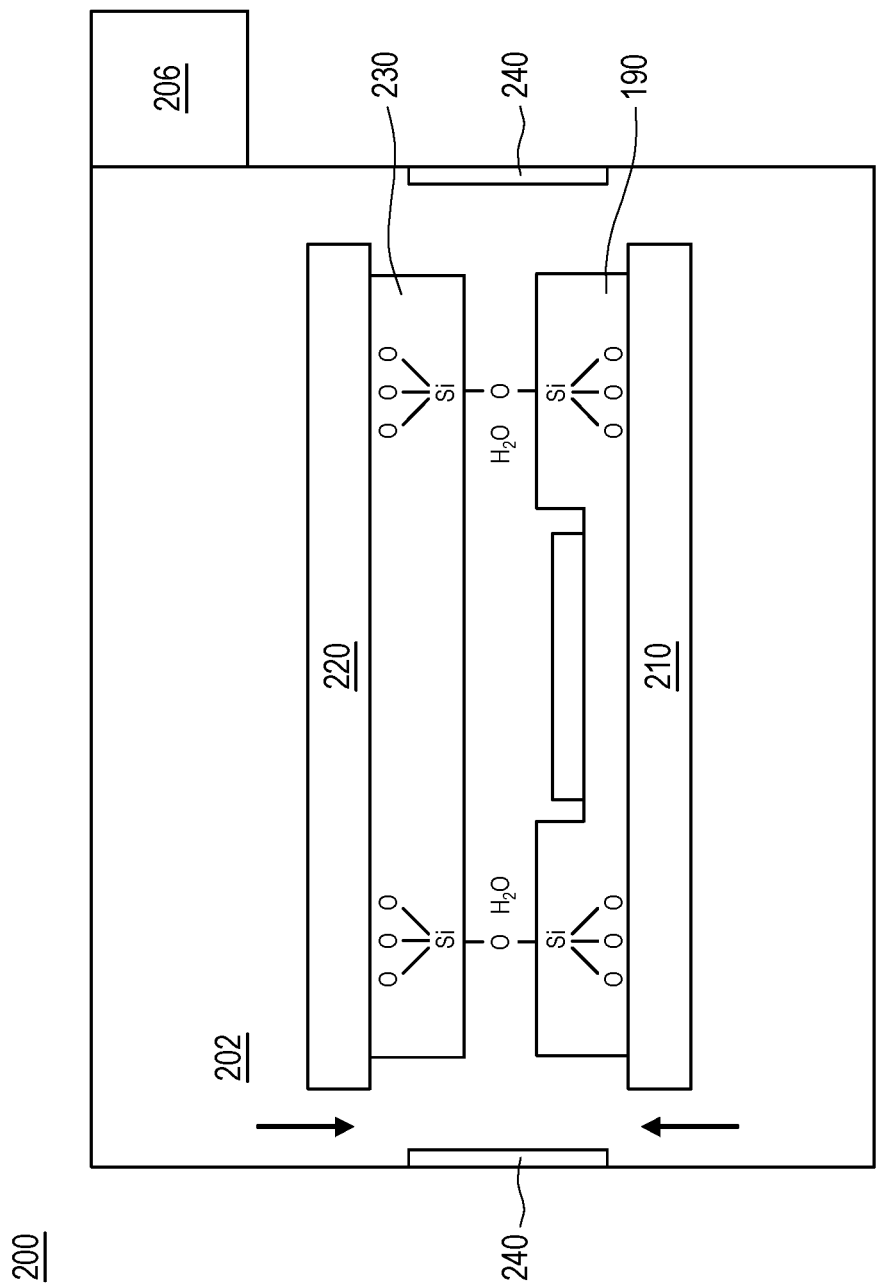
FIG. 6 is a side cross-sectional view showing the fusion bonding tool of FIG. 5 performing a fusion bonding process between two substrates.

Continuing in FIG. 6, the two wafer substrates 190, 230 are aligned and pressed together to cause bonding between their surfaces, without the presence of any intermediate layers. This is usually done by movement of one or both wafer support pedestals 210, 220 towards each other. The pressing force may be any force that accomplishes the task. In some particular embodiments, the pressing force is from about 5 kilonewtons (kN) to about 350 kN.

Initially, the two surfaces bond through van der Waals forces. The two wafer substrates are usually then annealed to strengthen the bond through formation of covalent bonds (indicated with heat source 240). As indicated here, silanol groups will react with each other to form a siloxane bond and a water molecule. Due to the lack of residual voltage here, water molecules do not adsorb to the two surfaces. The annealing may be performed at a temperature of about 100° C. to about 700° C., as desired, although other temperatures may be used as well. The annealing may be performed at any pressure ranging from vacuum to sub-atmospheric to atmospheric pressure. The annealing may be performed for any time period, for example from about 0.5 hours to about 4 hours. The atmosphere within the fusion bonding chamber can be manipulated as desired, for example using clean dry air (CDA), or a hydrogen ($H_2$) or nitrogen ($N_2$) atmosphere. The water molecules may diffuse away from the surface or outgas into the chamber 202.

Figure 7:
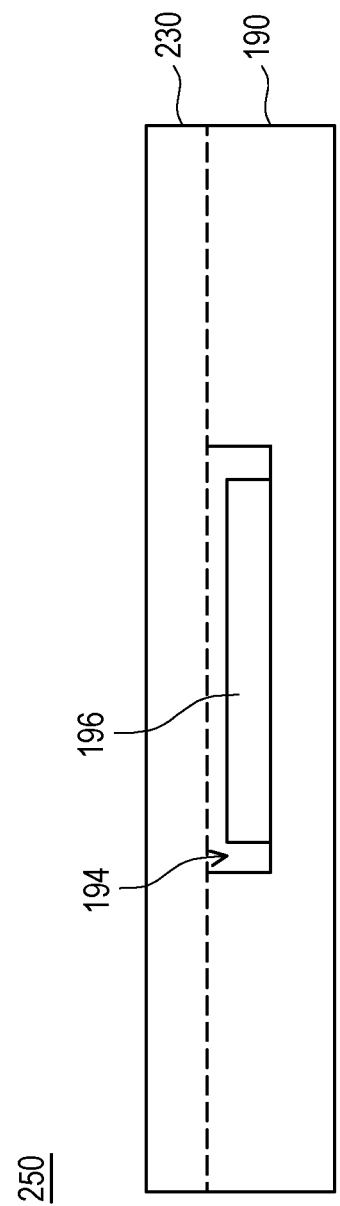
FIG. 7 is a side cross-sectional view showing the final multi-layer structure produced by fusion bonding, and after further processing.

FIG. 7 shows the final combined structure 250 formed from the two wafer substrates 190, 230. The fusion-bonded surface is indicated as a dotted line, with the MEMS device 196 being hermetically sealed within the cavity 194. The final structure can be further processed if desired. As one example of further processing, the thickness of the capping wafer may be reduced though CMP or some other process. For example, the capping wafer may have a starting thickness in FIG. 5 of several hundred micrometers, which is then reduced to a thickness of less than 100 micrometers in FIG. 7. As another example of further processing, the final structure can be cleaned again or undergo testing/certification processes.

Figure 8:
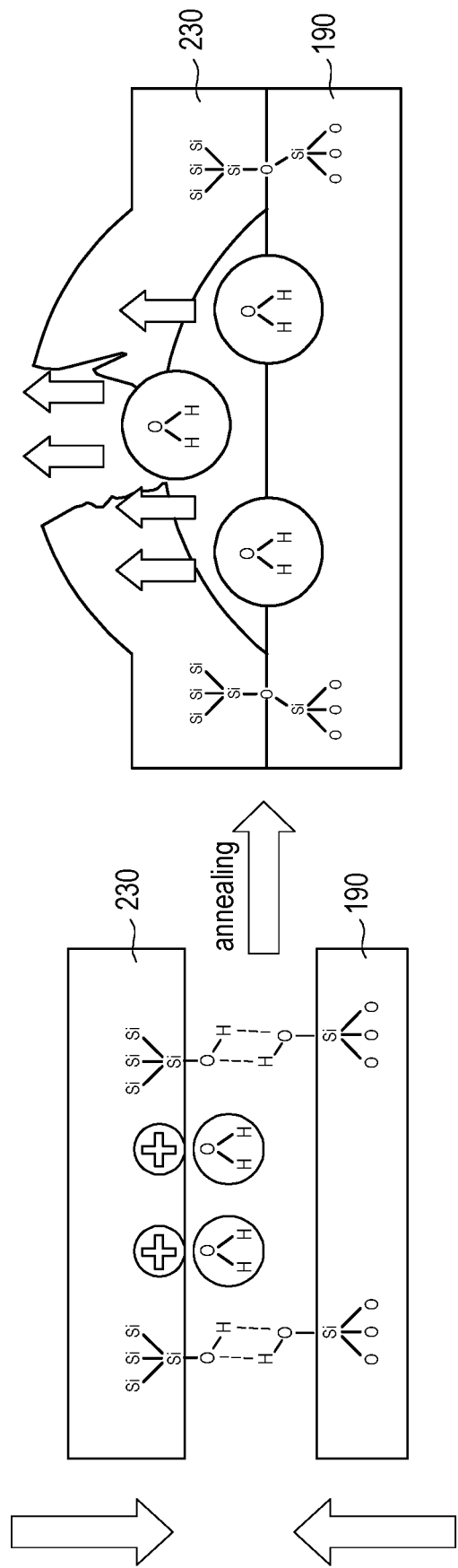
FIG. 8 is a schematic diagram illustrating adverse effects mitigated by the methods of the present disclosure.

FIG. 8 is a diagram illustrating adverse effects that can occur during fusion bonding if the residual voltage of the wafer substrate 190 is too high after plasma treatment. As illustrated here on the left side, the high surface charge can result in adsorption of water molecules to the wafer substrate surface. During the annealing step as illustrated on the right side, the outgassing of the water molecules can result in weakening of the bond between the two substrates 190, 230, permitting peeling of the two substrates apart from each other. These adverse effects are mitigated using the methods of the present disclosure to ensure that the residual voltage of the wafer substrate after plasma treatment is minimized.

Figure 9:
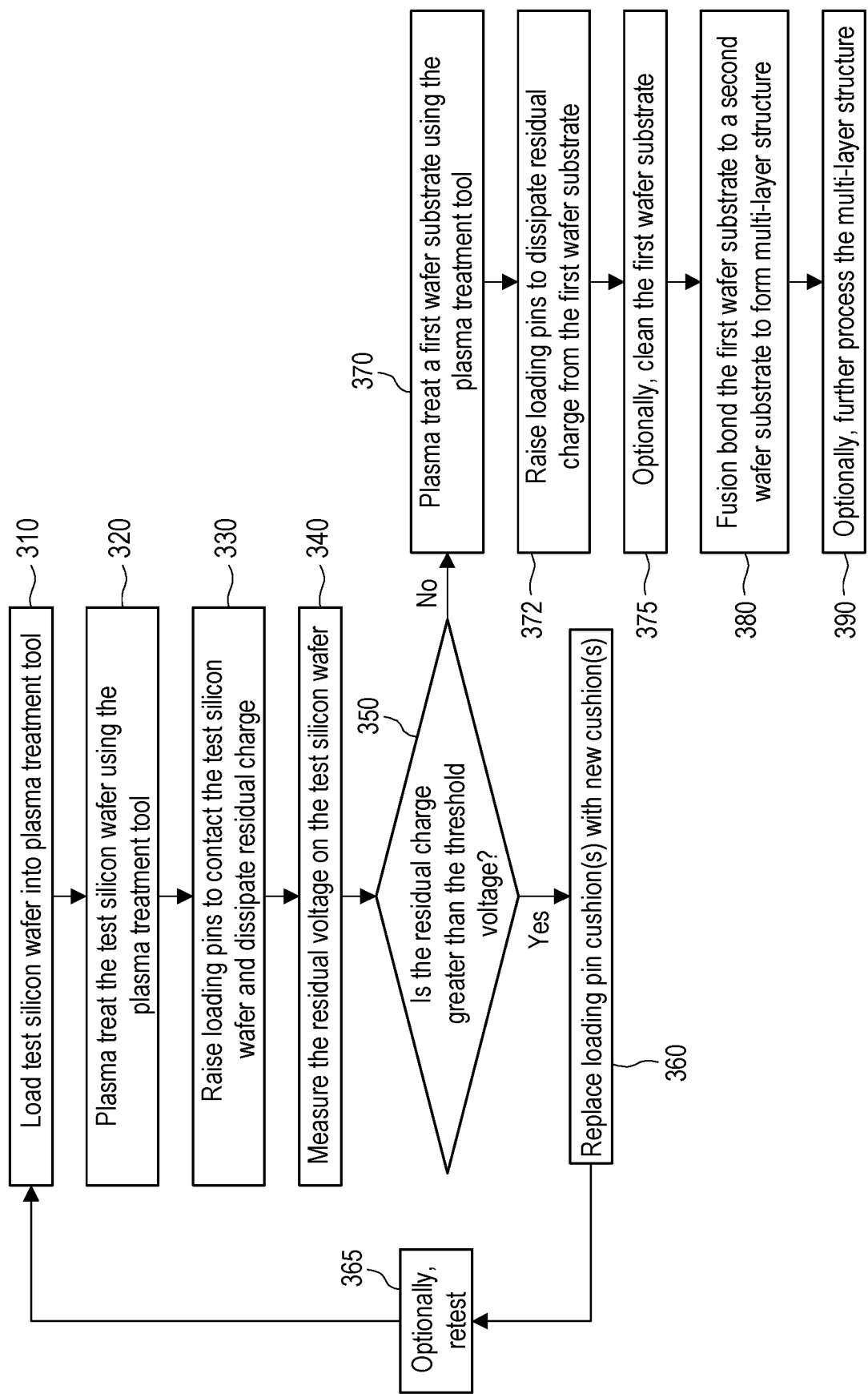
FIG. 9 is a flowchart illustrating a method for improving the fusion bond quality between two wafer substrates, or for reducing charge accumulation, or for identifying when loading pin cushions in a plasma treatment tool need to be replaced, in accordance with some embodiments.

To summarize, then, FIG. 9 is a flowchart that illustrates a method for improving the fusion bond quality between two wafer substrates. The various method steps are also illustrated in FIGS. 1-6.

In step 310, a test silicon wafer is loaded into a plasma treatment tool. Again, it is noted that the plasma treatment tool can be a standalone station/tool that performs only the plasma treatment function, or can be an integrated tool that performs the plasma treatment function along with other processing steps. This step is illustrated in FIG. 1.

Next, in step 320, a test silicon wafer is plasma treated in the plasma treatment tool. This step is illustrated in FIG. 2.

In step 330, loading pins are raised to contact the test silicon wafer and dissipate any residual charge. This step is illustrated in FIG. 3.

In step 340, the residual voltage remaining on the test silicon wafer is measured.

In step 350, the measured residual voltage is then compared to a threshold voltage. As previously mentioned, the threshold voltage may be about +100 volts, or about +300 volts, or about +3000 volts in different embodiments.

If the measured residual voltage is greater than the threshold voltage, then as indicated in step 360, at least one loading pin cushion of the wafer support pedestal is replaced with a new cushion. As indicated in optional step 365, the plasma treatment tool can be retested again if desired.

If the measured residual voltage is not greater than the threshold voltage, then the plasma treatment tool can continue to be used without needing to replace the loading pin cushions. Continuing with step 370, then, a first substrate can be plasma treated using the plasma treatment tool. In step 372, residual voltage is dissipated from the first substrate after plasma treatment. In optional step 375, the first substrate is cleaned. In step 380, the first substrate is fusion bonded to a second wafer substrate to form a multi-layer structure. The fusion bonding is illustrated in FIGS. 4-6. It is noted that the second substrate can also undergo the plasma treatment steps 370, 372, and 375 as well, although this is not described again here. Finally, in optional step 390, additional processing is performed on the multi-layer structure.

Referring to FIG. 1, FIG. 5, and FIG. 9, the controller 166, 206 in the systems of FIG. 1 and FIG. 5 may include one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the functions and structures described above (and/or embodied in the flowchart shown in FIG. 9) can be used to implement the methods for reducing charge accumulation and improving fusion bond quality, and for identifying when the loading pin cushions need to be replaced.

Continuing, FIG. 10 is a plan view showing a schematic for the layout of various stations used in the plasma treatment and fusion bonding processes of the present disclosure. Four different stations are illustrated: a plasma treatment station 400, a cleaning station 402, a fusion bonding station 404, and a substrate holding station 406. These four stations may be located around an automated material handling system 408 (AMHS) that may be configured to transfer the various wafer substrates between the four stations. For example, the AMHS may be in the form of a robotic arm that can grasp the various substrates. The plasma treatment station, cleaning station, and fusion bonding station operate as previously described. The substrate holding station is intended to protect the various substrates in between operations. For example, while a first substrate is being treated in the plasma treatment station 400, a second substrate may be held at the substrate holding station 406. Once the first substrate is transferred to the cleaning station 402, the second substrate can then be transferred from the substrate holding station 406 to the plasma treatment station 400.

A single controller 410 may be used to control the functions of the various stations 400, 402, 404, 406, 408 and to coordinate the movement of substrates between the stations. The stations may share common components, such as sources for common gases or vacuum pumps for reducing pressure, or ventilation systems. Alternatively, each station may be arranged with its own separate components and systems.

Figure 11B:
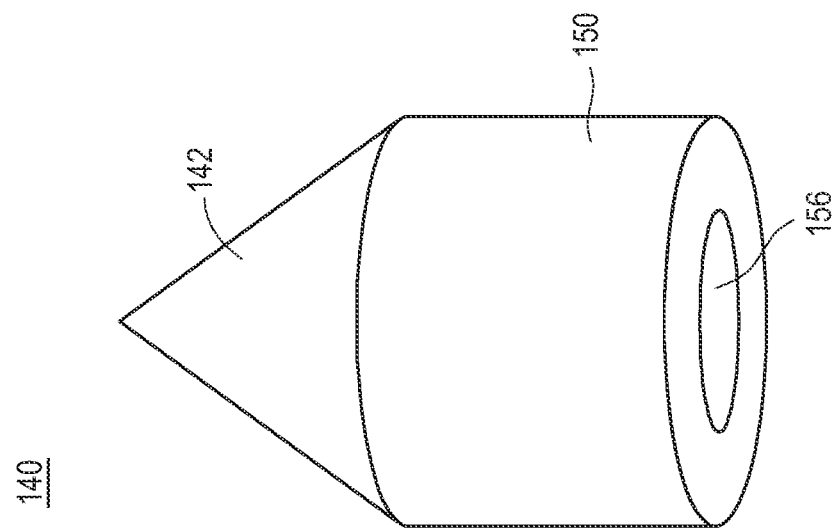
FIG. 11B is a lower perspective view of a loading pin cushion, in accordance with some embodiments.
Figure 11A:
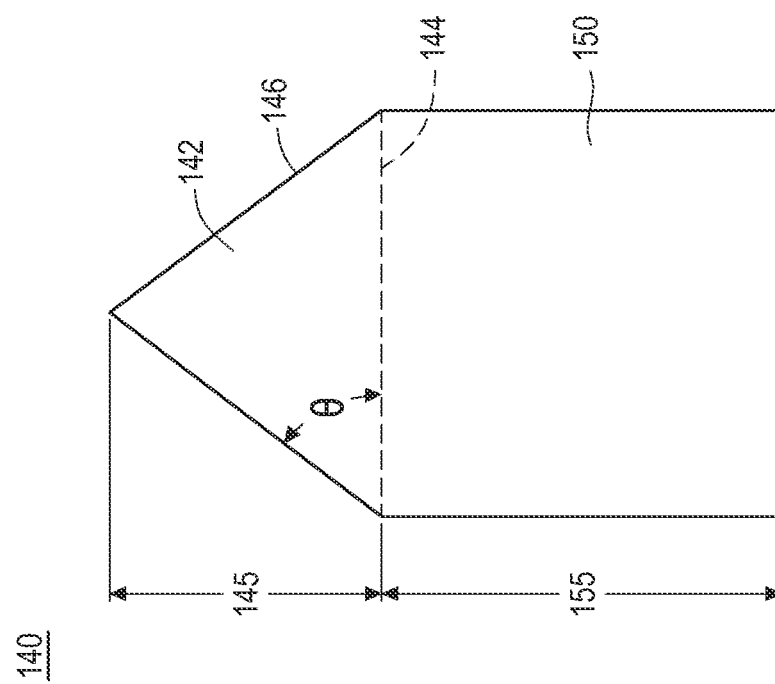
FIG. 11A is a side view of a loading pin cushion, in accordance with some embodiments.

Continuing, FIG. 11A and FIG. 11B are different views of one non-limiting embodiment of a loading pin cushion 140 of the present disclosure. FIG. 11A is a side view of the loading pin cushion, and FIG. 11B is a lower perspective view of the loading pin cushion. The loading pin cushion 140 includes an upper portion 142 and a lower portion 150, which generally have different shapes.

The upper portion 142 has a triangular cross-section, as seen in FIG. 11A. As illustrated in FIG. 11B, the upper portion is a cone, although other shapes are also contemplated (e.g. pyramidal). The angle between the base 144 and the lateral surface 146 of the upper portion is indicated as angle $\ominus$. Generally, the angle $\ominus$ must be greater than 0°, and must be less than 90°. However, in particular embodiments, the angle $\ominus$ is from about 15° to about 75°. In particular embodiments, the height of the upper portion, as indicated by reference numeral 145, is less than 2.0 millimeters (mm). The triangular cross-sectional shape is significant because it is desired for the contact area between the loading cushion pin and the wafer substrate to be as small as possible.

The lower portion 150 has a rectangular cross-section, as seen in FIG. 11A. As illustrated in FIG. 11B, the lower portion is cylindrical, although other shapes are also contemplated. In particular embodiments, the height of the lower portion, as indicated by reference numeral 155, is 5.0 mm or less. This height is significant because the resistance of the loading pin cushion is determined by the amount of material, and a reduced height thus reduces the resistance. A lower starting resistance for a "new" loading pin cushion (i.e. not yet exposed to plasma treatment) is desirable for increasing the service lifetime of the loading pin cushion. In particular embodiments, the resistance of the "new" loading pin cushion used to replace an "old" loading pin cushion is about $1 \times 10^{\wedge}10$ ohms or less (i.e. about 10 giga-ohms or less).

As seen in FIG. 11B, the lower portion of the loading pin cushion engages the loading pin itself. As illustrated here, the lower portion includes a bore 156 into which the loading pin is inserted. Other methods of engaging the loading pin are also contemplated, though not illustrated. Referring back to FIG. 1, the loading pin cushion 140 is of a width sufficient to fit within the electrically insulating tube 132.

The loading pin cushion is made from an electrically conductive material. Generally, the electrically conductive material should be soft, so as not to damage the wafer substrate. In some particular embodiments, the loading pin cushion comprises an electrically conductive silicone. A silicone, also known as a siloxane, is a polymer made of the repeating unit —$SiR_2O$—, where R is hydrogen or an alkyl group. The term "alkyl" refers to a fully saturated radical composed entirely of carbon atoms and hydrogen atoms. A silicone polymer by itself is usually not electrically conductive until mixed with an electrically conductive material.

Non-limiting examples of such materials may include carbon black or carbon nanotubes. The electrically conductive silicone can be cold cured, and can also be mixed with other materials such as caoutchouc (an unvulcanized natural rubber).

The other various components of the plasma cleaning and fusion bonding devices/systems can be made as desired from conventional materials, such as plastics and/or metals. The various components and their shapes and sizes can be made using conventional manufacturing techniques.

The methods of the present disclosure are particularly applicable to the Micro-Electro-Mechanical Systems (MEMS) and micro-electronic fields. There is frequently a need to bond two wafers together for the purpose of encapsulating MEMS devices within a cavity. This may be done to seal in a different atmosphere within the cavity, for example vacuum or a different gas. This may also be done to seal MEMS devices within the cavity away from the ambient environment, for example to prevent moisture or large particles from impeding the function of the MEMS device. Non-limiting examples of MEMS devices can include accelerometers, pressure sensors, gyroscopes, microphones, projection display chips, optical switches, magnetic field sensors, piezoelectric fluid dispensers, resonators for temperature measurement, ultrasonic transducers, RF switches, RF filters, and oscillators. Fusion bonding is a popular wafer bonding process without any additional intermediate layers used for encapsulation. Similar technologies that benefit from fusion bonding can include nanoelectromechanical systems (NEMS) devices, application specific integrated circuit (ASIC) devices, and other such devices.

Fusion bonding can also be used to build silicon-on-insulator (SOI) devices. Generally speaking, these devices have alternating layers of silicon substrate with an insulator substrate (e.g. $SiO_2$ or sapphire). These alternating layers can be fusion bonded together. Several benefits of this structure include reduced parasitic capacitance within the SOI device, lower leakage current, and reduced temperature dependency.

Fusion bonding also provides additional alternative structures and functionalities. For example, stacking different semiconductors (e.g., GaAs and Si) by fusion bonding facilitates the production of optical and electronic devices. Silicon-on-sapphire, which can have high defect densities when formed by conventional heteroepitaxy, can be realized with much lower defect densities by fusion bonding and result in improved RF circuit performance.

The methods of the present disclosure provide the advantage of improving fusion bond quality between two substrates, by reducing the residual charge/voltage on one or both of the substrates after a plasma treatment process which is performed prior to the fusion bonding process. Improved fusion bond quality results in increased production output by reducing the number of defective dies that may result from the joined substrates.

Some embodiments of the present disclosure thus relate to methods for improving fusion bond quality between a first substrate and a second substrate. A dummy silicon wafer is plasma treated in a plasma treatment tool. The residual voltage on the dummy silicon wafer is measured. If the measured residual voltage is greater than about +100 volts, then at least one cushion on a loading pin of a wafer support pedestal of the plasma treatment tool is replaced with a new cushion. A first substrate can subsequently be plasma treated using the plasma treatment tool. The first substrate is then fusion bonded to a second substrate.

Other embodiments of the present disclosure relate to a method for reducing charge accumulation in a plasma treatment tool. After a bare silicon wafer has been plasma treated, the residual voltage on the bare silicon wafer is measured. When the measured residual voltage is greater than about +300 volts, at least one cushion on a loading pin of a wafer support pedestal of the plasma treatment tool is replaced with a new cushion.

Other embodiments of the present disclosure relate to plasma treatment tools. The plasma treatment tool comprises an upper electrode and a wafer support pedestal spaced apart from the upper electrode. The wafer support pedestal includes a bottom electrode; at least one loading pin that passes through the bottom electrode within an insulating tube; a grounded loading pin base to which the at least one loading pin is electrically connected; and an electrically conductive cushion at an upper end of the at least one loading pin. In operation, the cushion contacts a wafer placed on the wafer support pedestal. An upper portion of the cushion has a triangular cross-section and a lower portion of the cushion has a height of 5.0 mm or less.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for improving fusion bond quality between a first substrate and a second substrate, comprising:
   plasma treating a dummy silicon wafer in a plasma treatment tool;
   measuring a residual voltage on the dummy silicon wafer;
   replacing at least one cushion on a loading pin of a wafer support pedestal of the plasma treatment tool with a new cushion if the measured residual voltage is greater than about +100 volts; and
   plasma treating a first substrate using the plasma treatment tool; and
   fusion bonding the first substrate to a second substrate.

2. The method of claim 1, wherein the plasma treatment of the dummy silicon wafer occurs at a pressure of about 10 kPa to about 95 kPa.

3. The method of claim 1, wherein all cushions on loading pins of the wafer support pedestal are replaced with new cushions.

4. The method of claim 1, wherein the measured residual charge with the new cushion is reduced to less than +100 volts.

5. The method of claim 1, wherein the new cushion has a resistance of less than $1 \times 10^{\wedge}10$ ohms.

6. The method of claim 1, wherein an upper portion of the new cushion has a triangular cross-section.

7. The method of claim 1, wherein a lower portion of the new cushion has a height of 5.0 mm or less.

8. The method of claim 1, wherein the new cushion is formed from an electrically conductive silicone.

9. The method of claim 8, wherein the electrically conductive silicone comprises carbon black or electrically conductive nanotubes.

10. A method for reducing charge accumulation in a plasma treatment tool, comprising:
    measuring a residual voltage on a bare silicon wafer after the silicon wafer has been plasma treated;
    replacing at least one cushion on a loading pin of a wafer support pedestal of the plasma treatment tool with a new cushion when the measured residual voltage is greater than about +300 volts.

11. The method of claim 10, wherein all cushions on loading pins of the wafer support pedestal are replaced with new cushions.

12. The method of claim 10, wherein the measured residual charge with the new cushion is reduced to less than +100 volts.

13. The method of claim 10, wherein the new cushion has a resistance of less than $1\times10^{\wedge}10$ ohms.

14. The method of claim 10, wherein an upper portion of the new cushion has a triangular cross-section.

15. The method of claim 10, wherein a lower portion of the new cushion has a height of 5.0 mm or less.

16. The method of claim 10, wherein the new cushion is formed from an electrically conductive silicone.

17. The method of claim 16, wherein the electrically conductive silicone comprises carbon black or electrically conductive nanotubes.

18. A method for identifying when at least one loading pin cushion in a plasma treatment tool needs to be replaced, comprising:
    measuring a residual voltage on a dummy silicon wafer after plasma treatment;
    if the measured residual voltage is greater than about +100 volts, replacing at least one loading pin cushion on a loading pin of the plasma treatment tool with a new loading pin cushion; and
    plasma treating a first substrate; and
    fusion bonding the first substrate to a second substrate.

19. The method of claim 18, wherein the residual voltage is measured using a metrology station that applies leads to the dummy silicon wafer.

20. The method of claim 18, wherein all cushions on loading pins of the wafer support pedestal are replaced with new cushions.

* * * * *